United States Patent
Seal et al.

(10) Patent No.: US 6,798,353 B2
(45) Date of Patent: Sep. 28, 2004

(54) METHOD OF USING FLASH MEMORY FOR STORING METERING DATA

(75) Inventors: Brian K. Seal, Westminster, SC (US); Eric Norrod, Westminster, SC (US); Stephen M. Simmons, Melbourne, FL (US)

(73) Assignee: Itron Electricity Metering, Inc., West Union, SC (US)

( * ) Notice: Subject to any disclaimer, the term of this patent is extended or adjusted under 35 U.S.C. 154(b) by 0 days.

(21) Appl. No.: 10/131,605

(22) Filed: Apr. 24, 2002

(65) Prior Publication Data

US 2003/0201904 A1 Oct. 30, 2003

(51) Int. Cl.[7] .............................................. G08C 25/00
(52) U.S. Cl. ................... 340/870.02; 365/226; 365/229; 711/161; 711/162
(58) Field of Search ...................... 340/870.02; 705/412, 705/405; 714/22, 36, 41, 42, 769, 14, 6, 15; 713/340; 365/226, 229, 227, 228; 711/161, 162; 716/1, 15

(56) References Cited

U.S. PATENT DOCUMENTS

| | | | |
|---|---|---|---|
| 4,327,410 A | * | 4/1982 | Patel et al. ................... 711/162 |
| 4,335,447 A | | 6/1982 | Jerrim |
| 4,361,877 A | | 11/1982 | Dyer et al. |
| 4,783,623 A | | 11/1988 | Edwards et al. |
| 4,792,677 A | | 12/1988 | Edwards et al. |
| 4,852,030 A | | 7/1989 | Munday |
| 5,270,639 A | | 12/1993 | Moore |
| 5,311,068 A | | 5/1994 | Miller |
| 5,377,114 A | | 12/1994 | Gross |
| 5,473,322 A | | 12/1995 | Carney |
| 5,548,527 A | | 8/1996 | Hemminger et al. |
| 5,918,380 A | | 7/1999 | Schleich et al. |
| 5,994,892 A | | 11/1999 | Turino et al. |
| 6,006,212 A | | 12/1999 | Schleich et al. |
| 6,069,827 A | | 5/2000 | Sinclair |
| 6,073,243 A | | 6/2000 | Dalvi et al. |
| 6,076,137 A | | 6/2000 | Asnaashari |
| 6,163,276 A | | 12/2000 | Irving et al. |
| 6,219,656 B1 | * | 4/2001 | Cain et al. ................... 705/412 |

* cited by examiner

*Primary Examiner*—Michael Horabik
*Assistant Examiner*—Hung Dang
(74) *Attorney, Agent, or Firm*—Dority & Manning, P.A.

(57) ABSTRACT

A metering data preservation and storage methodology, including steps for protecting data during periods in which power is lost to the meter, is provided. In particular, a methodology for using non-volatile flash memory structures is used in association with various volatile memory structures for the storage and preservation of metering data acquired from a solid-state utility meter. The methodology includes the use of the volatile memory structures for the temporary storage and alteration of the measured and calculated metering data so as to avoid an effective reduction in the lifespan of the non-volatile memory structure which can only be written, erased and rewritten to a finite number of times. Further, such usage reduces costs associated with the maintenance and incorporation of such memory types in the meter. The methodology further includes the use of the non-volatile flash memory as a permanent storage medium for the acquired metering data during power loss to the meter.

17 Claims, 3 Drawing Sheets

METHOD OF USING FLASH MEMORY FOR STORING METERING DATA

BACKGROUND OF THE INVENTION

The present subject matter generally relates to particular flash memory storage applications. More particularly, the present subject matter relates to a method of using flash memory for the storage of metering data. Still further, the present subject matter relates to a method for using flash memory in conjunction with random access memory (hereinafter RAM) for the storage of metering data and maintaining such data despite a loss of power.

Conventional memory systems are well known. Large amounts of data are commonly stored using rotating storage media such as magnetic disk drives. Such systems are slow to recover and store data. Additionally, such systems require large amounts of power and are relatively heavy.

Size constraints of certain existing flash memory systems have limited their typical use to storing programs and constants that are erased and then rewritten in their entirety. In general, such systems are not used to store data because data is typically not changed in its entirety. Instead, data has typically been stored in alternative memory structures, such as EPROMS, EEPROMS, and a variety of RAM structures, which allow the alteration of only a portion of the stored information. Such memory structures, however, are less cost effective than flash memory systems and in the case of certain types of RAM, namely battery-backed RAM, there are additional lifetime costs associated with the maintenance of the battery.

Early flash memory systems consisted of a single storage block for storing information. Such individual storage locations cannot be rewritten to until such time as they are erased. The erasure of stored information in such memory, however, cannot occur on a partial basis. Instead, erasure of such information must be complete at which point all previously stored information is lost.

Conventional flash memory systems have been developed such that they are more useful in storing data. Such flash memory has been segmented into large numbers of smaller storage locations. These most recent flash memory systems are flexible enough to store data and are ideally suited for use in the storage of metering data. While each of such storage blocks must still be erased in their entirety, such flash memory devices contain enough small storage blocks to satisfactorily maintain stored metering data.

These conventional flash memory systems consume very little power and are relatively fast to operate. New flash memory is also much more cost effective than non-volatile memory such as EPROM, EEPROM, etc. In additional to being more cost effective, such conventional flash memory systems are currently available in higher density arrays than comparable EEPROM and RAM memory systems. As the demand for the storage of more metering data is made in the utility industry, cost savings realized through the use of more efficient and cheaper memory systems will be significant.

While non-volatile memory systems have been used in the past in metering applications, their use is sometimes limited to the storage of constant values and equations for performing calculations that may determine otherwise desired parameters of a meter's performance or the demand therethrough. One such example of the limited use of such non-volatile memory structures in metering applications is U.S. Pat. No. 5,548,527, which is fully incorporated herein for all purposes by present reference thereto.

Similarly, U.S. Pat. No. 4,361,877, provides for the use of non-volatile memory to store a set of data measurements obtained over time and compiled within an associated memory. Such non-volatile memory is then removed for further processing to obtain the desired data and replaced by a new memory structure.

Utilizing a battery-backed RAM memory to store data, as well as to attempt to preserve such data during power outages to ensure the continuity of the usage data despite the power loss is the aim of U.S. Pat. No. 4,335,447. Both U.S. Pat. Nos. 4,335,447 and 4,361,877 are fully incorporated herein for all purposes by present reference thereto.

Other patents referencing the use of various types of memory structures to handle and store utility metering data include U.S. Pat. Nos. 4,783,623; 4,792,677; 4,852,030; 5,270,639; 5,311,068; 5,377,114; 5,473,322; 5,918,380; 5,994,892; 6,006,212; and 6,163,276.

While useful for their purposes, none of the above references solves the problems addressed by the presently disclosed technology, namely, the need for a cost-effective, efficient, non-volatile memory structure used to store metering data while not requiring replacement.

It is, therefore, desirable to provide a method for using a more cost-effective memory to store metering data. Still further, it is desirable to provide a method of using such memory in conjunction with an additional associated memory structure as a way to store metering data and maintaining such data despite a loss of power. Finally, it is desirable to utilize a mutli-segmented flash memory for storing metering data in conjunction with an associated memory structure for use in alteration and maintenance of the metering data during periods when measurements are taken and during a potential power loss to the meter.

BRIEF SUMMARY OF THE INVENTION

The present subject matter recognizes and addresses various of the foregoing limitations and drawbacks, and others, concerning the storage of measured metering data and the maintenance of that data during a loss of power. Therefore, the presently disclosed technology provides a new method of storing metering data into faster, more cost effective non-volatile flash memory structures. Still further, the present subject matter provides a new method of using flash memory in conjunction with RAM memory for storing metering data and maintaining such data despite a loss of power.

It is, therefore, a principle object of the disclosed technology to provide a method for using non-volatile flash memory for storing information. More particularly, it is an object of the present subject matter to provide a method for using such memory in association with RAM memory for storing and maintaining data.

It is a further object of the present subject matter to provide a method of protecting metering data during a loss of power. More particularly, it is an object of the present subject matter to provide a method of protecting metering data during a loss of power using a combination of volatile and non-volatile memory structures.

It is still another object of the presently disclosed technology to provide a method for storing metering data that is cost effective. In such context, it is a further object of the present technology to provide a more flexible and efficient method for the storage of metering data.

Additional objects and advantages of the present subject matter are set forth in, or will be apparent to those of ordinary skill in the art, from the detailed description as follows. Also, it should be further appreciated that modifications and variations to the specifically illustrated and discussed steps, features, and materials, or devices hereof may be practiced in various embodiments and uses of the disclosed technology without departing from the spirit and scope thereof, by virtue of present reference thereto. Such variations may include, but are not limited to, substitutions of equivalent steps, elements, features, and materials for those shown or discussed, and the functional or positional reversal of various steps, parts, features, or the like.

Still further, it is to be understood that different embodiments, as well as different presently preferred embodiments, of the present subject matter may include various combinations or configurations of presently disclosed steps, features, elements, or their equivalents (including combinations of features or configurations thereof not expressly shown in the figures or stated in the detailed description).

These and other features, aspects and advantages of the present technology will become better understood with reference to the following description and appended claims. The accompanying drawings, which are incorporated in and constitute a part of this specification, illustrate an embodiment of the present subject matter and, together with the description, serve to explain the principles of the technology.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
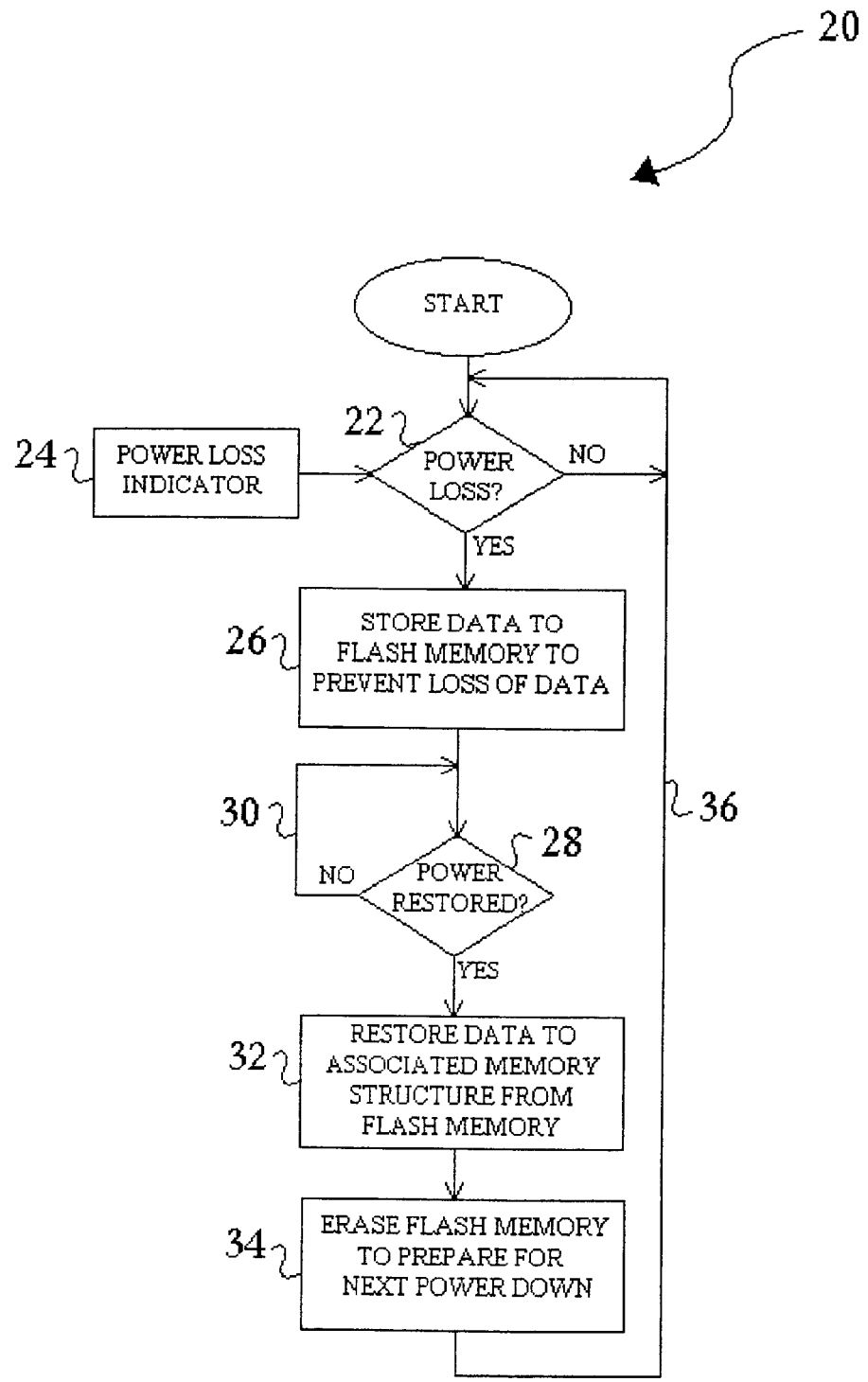
FIG. 1 is a flow chart diagram of the data preservation methodology for power loss occurrences in accordance with the present subject matter.

Repeat use of reference characters throughout the present specification and appended drawings is intended to represent the same or analogous features or elements of the disclosed technology.

DETAILED DESCRIPTION OF THE PREFERRED EMBODIMENTS

Reference will now be made in detail to presently preferred embodiments of the disclosed technology, examples of which are fully represented in the accompanying drawings. Such examples are provided by way of an explanation of the present technology, not limitation thereof. In fact, it will be apparent to those skilled in the art that various modifications and variations can be made in the present subject matter, without departing from the spirit and scope thereof. For instance, features illustrated or described as part of one embodiment can be used on another embodiment to yield a still further embodiment. Still further, variations in selection of materials and/or characteristics may be practiced, as well as, alteration of the order of method steps to satisfy particular desired user criteria. Thus, it is intended that the present subject matter cover such modifications and variations as come within the scope of the present features and their equivalents.

As disclosed above, the present subject matter is particularly concerned with a method of utilizing flash memory structures for the storage and retention of metering data. In particular, the present subject matter provides a method of using a flash memory structure with an additional associated memory structure in a utility metering environment. Certain embodiments of the disclosed technology are further directed to a method of insuring against data loss in the event of a power outage in a utility meter.

Generally, various metering data, including load profiles, energy data, time-of-use data, information data, and error/event logs are collected and stored for later retrieval either by authorized field personnel or via transmission to a remote location. Such information is often used to better determine appropriate billing rates both for various time periods during any 24 hour period, as well as, alternative billing rates for residential versus commercial users and for variations in demand from season to season.

In a first aspect of the presently preferred embodiment, FIG. 1 shows a flow chart diagram 20 in which a protection scheme for measured data during the occurrence of a power failure is provided. Metering data is stored in a supplemental memory structure, such as an EPROM, EEPROM, or a Ferro RAM, Shadow RAM, battery-backed RAM or other similar memory structure. Such supplemental memory is associated with a non-volatile flash memory structure, and thus may be hereafter referred to as "associated memory".

Upon the detection of an impending power loss, there is a need to save any previously measured or calculated metering data. In accordance with the present subject matter, there may exist means 22 for detection of a power loss. Power loss detection means 22 may correspond to a variety of particular implementations. For example, power losses could be detected during software instruction or via a specific sensor element or other appropriate circuitry. When such an event is detected at step 24, selected of the presently stored data is rewritten in step 26 into the non-volatile flash memory from the associated memory structure. In certain instances, it is desired to transfer the entire contents of the associated memory structure into flash memory at step 26. By definition, the non-volatile flash memory structure will maintain without loss all of the data stored therein despite the lack of power to the memory. In such a manner, all of the previously acquired metering data may be preserved.

Continuing with the exemplary embodiment of the present subject matter illustrated in FIG. 1, upon the occurrence of step 26 a meter begins checking at step 28 for a restoration of power to the meter. Checking for the restoration of power, while forming no particular aspect of the present technology, may be accomplished in any of numerous previously known ways. If no power is detected at step 28, the power detection methodology loops back at path 30 and continues to check for power restoration until power is detected. Upon detection in step 28 of the restoration of power to the solid-state meter, all the data previously transferred in step 26 is restored to the associated memory structure in step 32. Once the metering information is restored to the associated memory from the flash memory in step 32, the flash memory location is erased in step 34. Step 34 ensures that the flash memory will be prepared to store new information upon a subsequent power failure. After completion of exemplary step 34, the process loops back along path 36 to the beginning of the process 20 where the meter once again begins checking for the next loss of power.

In such method, the limited use of the non-volatile flash memory structure aids in reducing the continuous writing, erasing and rewriting of data, which limits the useful life of the memory structure itself. Furthermore, due to the somewhat limited nature of flash memory (i.e., requiring an entire storage block of data to be erased and written over anew), such methodology aids in reducing the time required by the metering system to properly record each newly measured or calculated piece of data.

Figure 2:
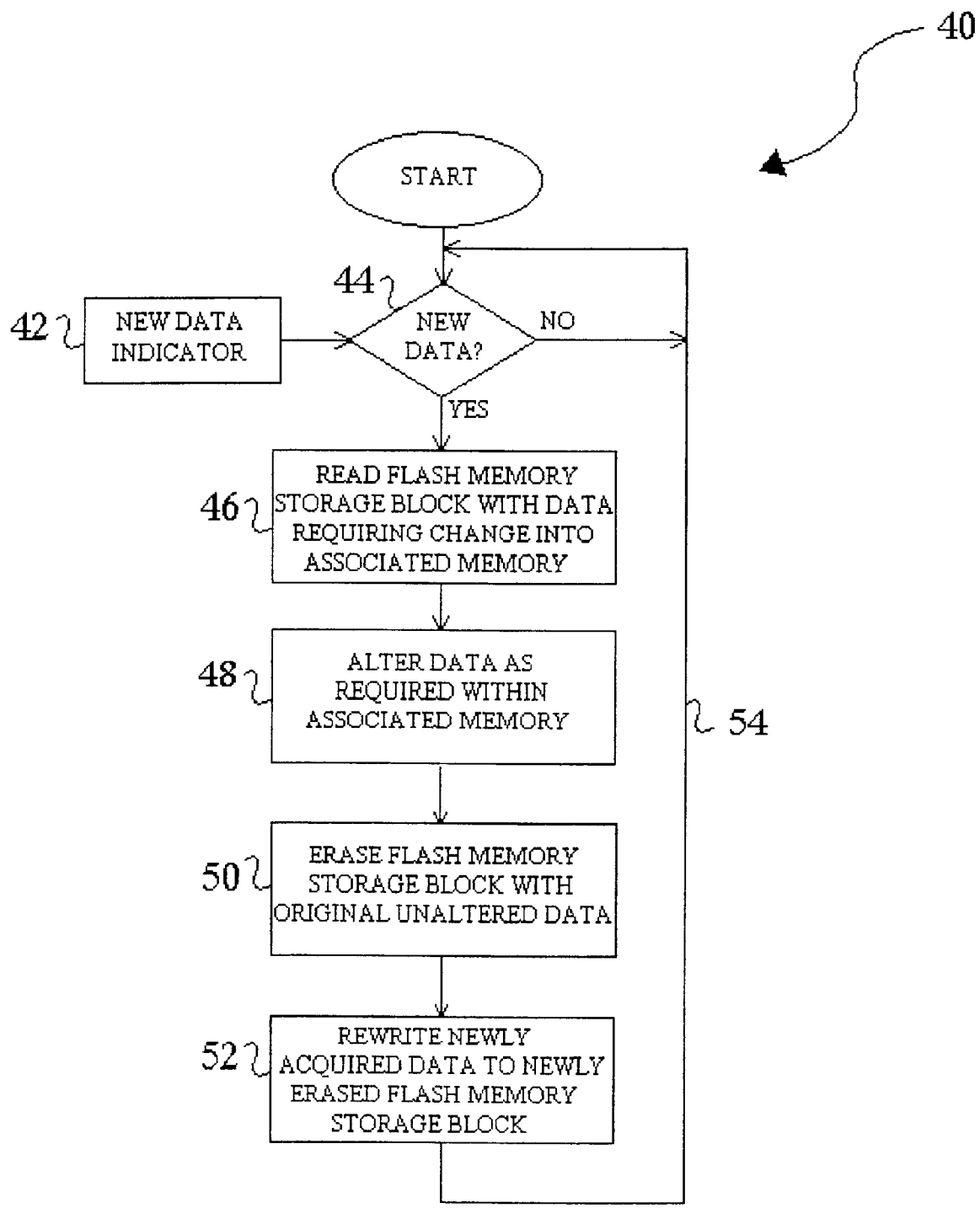
FIG. 2 is a flow chart diagram of the data storage methodology for newly acquired data in accordance with the present subject matter.

In accordance with another aspect of the present subject matter, FIG. 2 displays a flow chart representative of an exemplary process 40 in which a memory structure associated with flash memory in a utility meter is used for the temporary storage and alteration of recorded metering data. In the presently preferred embodiment, metering data is permanently stored in a multi-segmented non-volatile flash memory structure. An associated memory structure comprised of EPROM, EEPROM, Ferro RAM, Shadow RAM, battery-backed RAM or other similar memory structure is also provided. Each of such non-volatile flash memory structure's segments contains measured and recorded metering data from a typical residential or commercial use solid-state utility meter. It should be noted that such meter forms no particular aspect of the present technology and are well known to those of ordinary skill in the art. As such, the meter itself will not be discussed herein.

Upon the acquisition of newly measured or calculated data, there exists a need to update the stored information. In accordance with the present subject matter, the detection of this new data may be done in a variety of fashions and is indicated in FIG. 2 as new data indicator 42. One example of how new data could be indicated is to compare newly acquired data to that already stored in non-volatile memory to determine if the data requires alteration. The present subject matter employs a process such as exemplary data preservation and storage method 40 to update newly acquired meter data. Such methodology works to reduce the number of times the non-volatile flash memory must be erased and rewritten thus lengthening its effective lifespan within the meter.

Continuing with the exemplary process 40 of FIG. 2, a determination of whether stored data needs updating is effected in step 44. Upon determining in step 44 that new data is indeed at hand, the storage block containing the old data is read from the non-volatile flash memory structure and copied into an associated memory structure in step 46.

Recent advances in flash memory have provided for small erase-block flash memory structures. This means that the amount of data read into an associated memory structure in step 46 is much smaller than might previously have been possible. Such advances in flash memory technology make the use of flash memory in metering applications more feasible since exemplary metering systems require about 256K of non-volatile memory and about 2K of supplemental memory. Thus, the amount of data read into an associated memory structure in step 46 has a minimum and maximum limit based on specific memory constraints. The minimum amount of data read from flash memory is equal to the smallest block size in flash memory. Existing flash memory may be characterized by about a thousand blocks or more per data array. The maximum amount of data read from flash memory in step 46 is determined by the storage limit of the associated memory structure.

The associated memory structure may be one that allows for the alteration of data without the need for eliminating all of the data and replacing it with the newly acquired metering data as is the case with flash memory. Instead, only individual bits of information as needed within the entire storage block can be changed in such memory structure thus reducing the time required for updating the data. Thus, a selected block or blocks of data is read into the associated memory in step 46, at which point data can be altered within the associated memory in step 48.

On the completion of the alterations of the previously stored data in the associated memory structure in step 48, the non-volatile flash memory segment previously containing the unaltered data may be fully erased in step 50. The now updated data may then be rewritten into the newly erased storage block of the non-volatile flash memory in step 52. In accordance with the presently disclosed technology, the method then feeds back at path 54 to repeat itself so as to continuously offer the most up-to-date metering data.

While it forms no particular aspect of the present subject matter, the non-volatile flash memory structures may be provided to contain enough data to represent a utility-provider-defined time period such as one month. In such an instance, appropriate field personnel may "read" the meter to obtain the data either through direct viewing or by remote transmission/reception of the data at regular intervals so as to avoid the loss of any of the metering data.

Figure 3:
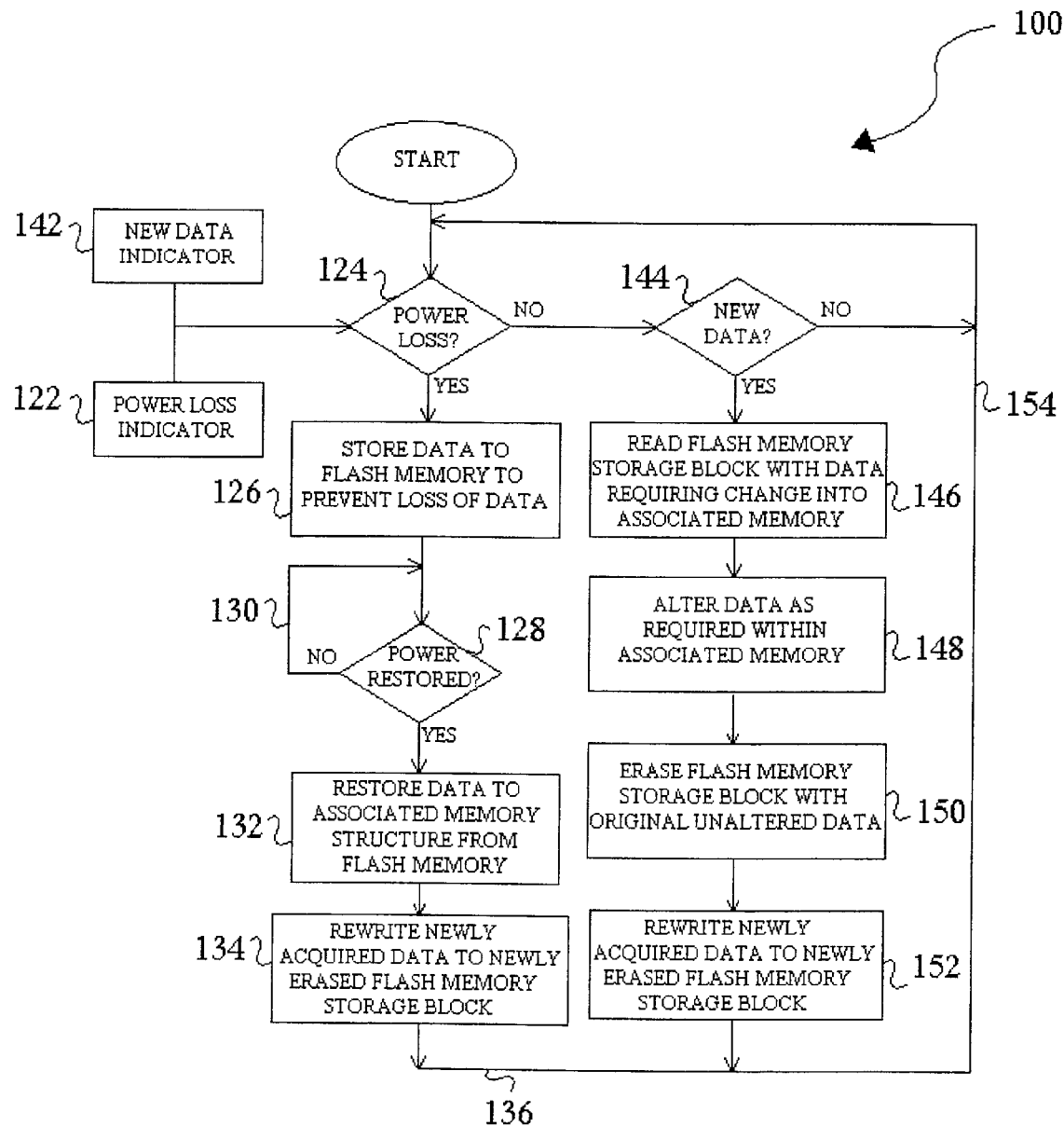
FIG. 3 is a flow chart diagram of a data preservation and storage methodology that provides a data protection scheme during power loss to the meter in accordance with the present subject matter.

FIG. 3 represents a flow chart diagram of the an exemplary embodiment in which both data preservation and storage methodologies are provided, wherein such methodologies includes a data protection scheme for periods during which power is lost to the meter. Such methodology 100 preferably includes both means 142 for detecting newly acquired data and means 122 for determining an impending power loss 122. Means 142 may be implemented in a similar fashion to new data indicator means 42 and means 122 may be implemented in a similar fashion to power loss indication means 22.

In an effort to avoid the loss of any previously acquired meter data in the event of a power failure, a first step in exemplary method 100 corresponds to checking for such a power loss with detection means 122. If a power loss is detected at step 124, then there exists a need to transfer the metering data to a non-volatile memory structure. Upon a finding that such a need exists, all metering data within the associated memory structure used for temporary storage and alteration of data may be transferred to the non-volatile flash memory structure in step 126.

Exemplary methodology 100 then begins a continuous check in steps 128 and 130 to determine if power has been restored to the solid-state meter. Such a determination may be made through any of the known methods and as it forms no particularly critical aspect of the present subject matter such methods will not be further explored herein. Upon a detection of the restoration of power to the meter in step 128, all of the data located within the non-volatile flash memory structure may be rewritten to the associated memory in step 132. The appropriate location in flash memory should then be erased in step 134 such that new data can be stored there again upon another power failure.

During its interrogation of the power loss detection means should there exist no impending power loss, the methodology of the present technology next interrogates the newly acquired data detection means 142 in step 144. Such detection may operate to either automatically update the non-volatile flash memory upon each measurement or, more preferably, there may exist a means 142 for comparing the newly acquired data to that already stored in the non-volatile memory to determine if the data requires alteration. The later method works to reduce the number of times the non-volatile flash memory must be erased and rewritten thus lengthening its effective lifespan within the meter.

When it is determined in step 144 that the stored data requires updating, the storage block containing the old data is read from the non-volatile flash memory structure and copied into the associated memory structure in step 146. The determination of the appropriate storage block of memory may be based on the use of a ring flash memory such that each successive set of newly acquired data belongs in the next successive segment of the ring memory.

Desired alterations to the data previously stored in the associated memory structure are then performed in step 148. After this alteration is performed, the non-volatile flash memory segment previously containing the old data may be fully erased in step 150. The now updated data may then be rewritten into the newly erased storage block of the non-volatile flash memory in step 152. In accordance with the present technology, the methodologies then repeat themselves at paths 136 and 154 so as to continuously obtain the most up-to-date metering data while ensuring the protection of the already acquired metering data.

Although preferred embodiments of the disclosed technology have been described using specific terms and steps, such description is for illustrative purposes only. The words used are words of description rather than of limitation. It is to be understood that changes and variations may be made by those of ordinary skill in the art without departing from the spirit or the scope of the present subject matter, which is set forth in the following claims. In addition, it should be understood that aspects of various other embodiments may be interchanged both in whole or in part. Therefore, the spirit and scope of the appended claims should not be limited to the description of the preferred version contained herein.

What is claimed is:

1. A method for storing meter data comprising the steps of:
   providing a plurality of memory structures, wherein said plurality of memory structures includes at least one multi-segmented non-volatile memory structure and at least one additional associated memory structure;
   measuring a plurality of utility-provider defined metering data;
   detecting the existence of newly acquired or updated metering data;
   determining a segment of said at least one non-volatile memory structure where the newly acquired or updated metering data is to be stored;
   reading the data from the non-volatile memory structure segment from said determining step into said associated memory structure;
   altering selected data within the associated memory structure;
   erasing the segment of the non-volatile memory structure that was transferred in said step of reading the data; and
   rewriting the altered data from the associated memory structure to the erased segment of said non-volatile memory structure.

2. A method as set forth in claim 1, wherein said at least one multi-segmented non-volatile memory structure comprises flash memory.

3. A method as set forth in claim 2, wherein said at least one associated memory structure is selected from the group consisting of EPROM, EEPROM, Ferro RAM, Shadow RAM, and battery-backed RAM.

4. A method as set forth in claim 1, wherein said utility-provider defined metering data includes information corresponding to at least one of load profiles, energy data, time-of-use data, informational data or error/event logs.

5. A method as set forth in claim 2, further comprising the step of:
   comparing the data from the non-volatile memory structure segment of said determining step to the newly acquired or updated metering data whereby the selected data in the associated memory to be altered in said altering step is determined.

6. A method as set forth in claim 2, wherein said non-volatile flash memory is a ring memory and wherein said step of determining a segment of said flash memory where the newly acquired or updated metering data is to be stored is a function of reading the next successive segment of said ring flash memory.

7. A utility metering data storage, alteration and preservation method, including steps for protecting data during periods in which power is lost to a meter, said method comprising the steps of:
   (a) providing a plurality of memory structures, wherein said plurality of memory structures includes at least one non-volatile memory structure and at least one associated memory structure;
   (b) measuring utility-provider defined metering data;
   (c) checking for any impending power loss to said meter and upon a failure to detect any impending power loss to said meter skipping to step (j);
   (d) reading all previously acquired metering data into said at least one associated memory structure;
   (e) rewriting said previously acquired metering data to said at least one non-volatile memory structure;
   (f) testing for a restoration of power and repeating step (f) until a positive indication of such is obtained;
   (g) restoring said previously acquired metering data from said at least one non-volatile memory structure to said at least one associated memory structure upon a restoration of power to said plurality of memory structures;
   (h) erasing a portion of said at least one multi-segmented non-volatile memory to enable new data to be written therein;
   (i) returning to step (c);
   (j) checking for the existence of newly acquired or updated metering data and upon a failure to detect said newly acquired or updated metering data skipping to step (c);
   (k) determining the segment of said at least one non-volatile memory structure which contains the previously acquired metering data requiring replacement or updating;
   (l) reading said non-volatile memory structure segment into said associated memory structure;
   (m) altering said previously acquired metering data within said associated memory structure;
   (n) erasing said previously acquired metering data from said segment of said non-volatile memory structure;
   (o) rewriting said newly acquired or updated metering data to said erased segment of said non-volatile memory structure; and
   (p) repeating step (c).

8. A method as set forth in claim 7, wherein said at least one multi-segmented non-volatile memory structure comprises flash memory.

9. A method as set forth in claim 8, wherein said at least one associated memory structure is selected from the group consisting of EPROM, EEPROM, Ferro RAM, Shadow RAM, and battery-backed RAM.

10. A method as set forth in claim 7, wherein said utility-provider defined metering data includes at least one of a load profiles, energy data, time-of-use data, informational data or error/event logs.

11. A method as set forth in claim 8, wherein said non-volatile flash memory is a ring memory and wherein said determination of the segment of said flash memory containing said previously acquired metering data in need of updating is a function of reading the next successive segment of said ring flash memory.

12. A method as set forth in claim 8, further comprising the step of:

providing a means for detecting an impending power loss and a restoration of power to said memory structures.

13. A method as set forth in claim 8, further comprising the step of:

characterizing said newly acquired or updated metering data as either necessitating or not necessitating a change to said previously acquired metering data.

14. A method as set forth in claim 13, wherein said characterization is based on a comparison of the previously acquired metering data and said newly acquired or updated metering data and upon the event that said previously acquired and said newly acquired metering data are identical no alteration of the data is required.

15. A utility metering data storage, alteration and preservation method, including steps to protect data for periods during which power is lost to a meter, said method comprising the steps of:

(a) testing for an impending power loss to a meter and wherein no such failure is detected, skipping to step (f);

(b) copying all previously acquired metering data from an associated memory structure to a non-volatile memory structure;

(c) testing for a restoration of power to said meter until a positive indication of said power restoration is detected;

(d) restoring all previously acquired metering data to said associated memory structure;

(e) returning to step (a);

(f) testing for newly acquired or updated metering data and wherein no such indication is detected skipping to step (c);

(g) reading said previously acquired metering data into said associated memory structure;

(h) altering said previously acquired metering data;

(i) rewriting said newly acquired or updated metering data to said non-volatile memory structure; and (j) repeating step (a).

16. A method as set forth in claim 15, wherein said at least one multi-segmented non-volatile memory structure comprises flash memory.

17. A method as set forth in claim 16, wherein said at least one associated memory structure is selected from the group consisting of EPROM, EEPROM, Ferro RAM, Shadow RAM, and battery-backed RAM.

* * * * *

UNITED STATES PATENT AND TRADEMARK OFFICE
CERTIFICATE OF CORRECTION

PATENT NO. : 6,798,353 B2
DATED : September 28, 2004
INVENTOR(S) : Seal et al.

It is certified that error appears in the above-identified patent and that said Letters Patent is hereby corrected as shown below:

Title page,
Item [56], References Cited, U.S. PATENT DOCUMENTS, please add the following:

| -- 4,959,774 | 9/1990 | Davis, John E. | 714/6 |
| 5,396,637 | 3/1995 | Harwell et al. | 365/228 |
| 5,428,252 | 6/1995 | Walker et al. | 307/64 |
| 5,799,200 | 8/1998 | Brant et al. | 713/340 |
| 6,535,996 | 3/2003 | Brewer et al. | 714/14 -- |

Signed and Sealed this

Third Day of May, 2005

JON W. DUDAS
*Director of the United States Patent and Trademark Office*